United States Patent [19]

Kurihara et al.

[11] Patent Number: 5,242,856
[45] Date of Patent: Sep. 7, 1993

[54] METHOD OF MANUFACTURING A WINDOW STRUCTURE SEMICONDUCTOR LASER

[75] Inventors: Haruki Kurihara, Tokyo; Hideo Tamura; Hirokazu Tanaka, both of Kanagawa, all of Japan

[73] Assignee: Kabushiki Kaisha Toshiba, Kawasaki, Japan

[21] Appl. No.: 590,797

[22] Filed: Oct. 1, 1990

[30] Foreign Application Priority Data

Oct. 11, 1989 [JP] Japan .................................. 1-264715

[51] Int. Cl.$^5$ .................. H01L 33/00; H01S 3/085
[52] U.S. Cl. ........................... 437/129; 148/DIG. 95; 437/133; 437/160; 437/165; 437/167; 437/987
[58] Field of Search ............. 148/DIG. 37, 50, 56, 148/65, 72, 95, 110, 168, 169, 33, 33.2, 33.4, 33.5; 357/16, 27; 372/43, 44, 46, 48; 437/81, 89, 90, 108, 110, 111, 126, 129, 133, 160, 165, 167, 247, 936, 987

[56] References Cited

U.S. PATENT DOCUMENTS

| | | | |
|---|---|---|---|
| 4,759,025 | 7/1988 | Kamejima | 372/46 |
| 4,810,670 | 3/1989 | Furuyama et al. | 437/129 |
| 4,827,483 | 5/1989 | Fukuzawa et al. | 372/46 |
| 4,879,724 | 11/1989 | Matsumoto et al. | 372/46 |
| 4,879,725 | 11/1989 | Kawanishi et al. | 372/48 |
| 4,926,431 | 5/1990 | Kawanishi et al. | 372/46 |
| 4,926,432 | 5/1990 | Hattori | 372/46 |
| 4,937,835 | 6/1990 | Omura | 372/48 |
| 4,951,290 | 8/1990 | Miromoto et al. | 372/46 |
| 4,961,196 | 10/1990 | Endo | 372/46 |
| 5,010,556 | 4/1991 | Imanaka et al. | 437/129 |

FOREIGN PATENT DOCUMENTS 0306314 3/1989 European Pat. Off. .
0319207 6/1989 European Pat. Off. .
0142690 11/1981 Japan .................................. 437/129
0136984 8/1984 Japan .................................. 372/46

OTHER PUBLICATIONS

Periodic Table of Elements from the Inside lefthand cover of CRC Handbook of Chemistry and Physics, 70th edition, 1989-90.
Extended Abstracts (The 32nd Spring Meeting, 1985). The Japan Society of Applied Physics and Related Societies, 30p/-ZB-1-; Tohta, et al.; Mar. 30, 1985.
Extended Abstracts (The 48th Autumn Meeting, 1987) The Japan Society of Applied Physics and Related Societies, 18A-ZR-f; K. Tateoka, Oct. 18, 1987.
Suzuki et al., *Fabrication of GaAlAs 'Window-Stripe' Multi-Quantum-Well Heterostructure Lasers Utilising Zn Diffusion-Induced Alloying*, 20 Elecs. Let. No. 9, 383, Apr. 1984.
Naito et al., *Highly-Reliable CW Operation of 100 mW GaAlAs Buried Twin Ridge Substrate Lasers with Nonabsorbing Mirrors*, 25 IEEE J. Quantum Mech. No. 6, 1495, Jun. 1989.
Nakashima et al., *AlGaAs Window Stripe Buried Multi--Quantum-Well Lasers Fabricated by Zn-Diffusion-Induced Disordering*, 11th Eur. Conf. on Optical Communication, Venezia, Oct. 1-4, 1985, at 497-500.

Primary Examiner—Mary Wilczewski
Attorney, Agent, or Firm—Banner, Birch, McKie & Beckett

[57] ABSTRACT

In a method of manufacturing a semiconductor laser which includes a window structure at the periphery of an active layer. The width of the optical waveguide is determined by an etching, and the window structure is formed by an interdiffusion of atoms between a carrier confining layer and the active layer.

4 Claims, 6 Drawing Sheets

METHOD OF MANUFACTURING A WINDOW STRUCTURE SEMICONDUCTOR LASER

BACKGROUND OF THE INVENTION

1. Field of the Invention

This invention concerns a method of manufacturing a semiconductor laser. More particularly, this invention concerns a method of manufacturing a window structure semiconductor laser.

2. Description of the Prior Art

Once the optical power density at mirrors of a semiconductor laser exceeds several MW/cm2, the mirrors suffer from Catastropic Optical Damage (COD), which is a local destruction caused by local heating resulting from absorption of the laser light by an active layer. Thus, the maximum available optical power of a semiconductor laser has been limited by COD.

However, this limitation has been overcome by an improved structure called a "window structure", in which non-absorbing regions called "window" are provided near the mirror so that the local heating may be reduced.

FIG. 1 shows a conventional window structure semiconductor laser disclosed in "Shuuki Ouyou Butsuri Gakkai Kouen Yokoushu, 12a-ZR-8" (Extended Abstracts 12a-ZR-8, The 48th Autumn Meeting, 1987, The Japan Society of Applied Physics and Related Societies in Japan). In this drawing, the portion illustrated by a dotted line is partially cutaway for convenience of illustration. In this structure, an active layer within about 30 $\mu$m from the mirror is removed to eliminate the absorption of the laser light and to form the window.

The semiconductor laser of FIG. 1 comprises a semiconductor substrate 11 made of III-V compound semiconductor mixed crystal, a current blocking layer 12, a lower cladding layer 13, an optical waveguide layer 14, an active layer 15, a first upper cladding layer 16, an antioxidizing layer 17, a second upper cladding layer 18 and an ohmic contact layer 19. Furthermore, the laser includes upper electrode layer 20 on the ohmic contact layer 19 and a lower electrode layer 21 under the substrate 11.

FIGS. 2A to 2F show a method of manufacturing the structure shown in FIG. 1. At first, a semiconductor substrate 11 made of P-type GaAs is prepared. The main surface of the substrate is partially etched to form a mesa 11A of about 1 $\mu$m height. (FIG. 2A)

Next, a current blocking layer 12 made of N-type GaAs is formed on the substrate 11 by a liquid phase epitaxial method. (FIG. 2B) Due to the characteristic of the epitaxial method, the surface of the current blocking layer 12 becomes flat.

Then, an etching is carried out to form a mesa 12A of 1 $\mu$m height and 20 $\mu$m width. (FIG. 2C)

Next, an etching is carried out to form a groove 12B partially exposing the mesa (shown as 11B) of the semiconductor substrate so as to form a current path. (FIG. 2D)

Then, a lower cladding layer 13 made of P-type $Al_{0.41}Ga_{0.59}As$ having 0.2 $\mu$m thickness, an optical waveguide layer 14 made of P-type $Al_{0.31}Ga_{0.69}As$ of 0.15 $\mu$m thickness, an active layer 15 made of P-type of N-type $Al_{0.08}Ga_{0.92}As$ of 0.06 $\mu$m thickness, a first upper cladding layer 16 made of N-type $Al_{0.41}Ga_{0.59}As$ and an antioxidizing layer 17 made of N-type $Al_{0.15}Ga_{0.85}As$ are successively formed by the liquid phase epitaxial method. (FIG. 2E)

Next, an etching is performed to partially remove the antioxidizing layer 17, the first upper cladding layer 16 and the active layer (15) at the vicinity of the emitting facet, corresponding to the area 22 and 23 in FIG. 1. (FIG. 2F)

Then, a second upper cladding layer 18 made of N-type $Al_{0.41}Ga_{0.59}As$ and an ohmic contact layer 19 made of N-type GaAs are formed successively by Metalorganic Chemical Vapor Deposition (MOCVD) method.

After an upper metallic electrode 21 and a lower metallic electrode layers 20 are formed, the wafer thus formed is cleaved to produce a semiconductor laser having mirror surfaces 25 and 26 (See FIG. 1).

In this construction, the cladding layer 13 is made so thin outside the groove 12B that the laser light, which is guided along the optical layer 14, penetrates into the current blocking layer 12 and suffers from the losses. This results in mode confinement just above the groove 12B and provides a waveguide parallel to the junction plane. This waveguide is classified to a complex index guide by its waveguiding mechanism.

A stable single lateral mode operation, which is essential for practical use of laser diodes, is general achieved by restricting the width W of the waveguide to a critical value. This critical value is about 5 $\mu$m for the complex index guide of this prior art, in which the width of the waveguide is equal to the width of the groove 12B. within this restriction, W is designed as wide as possible because the available maximum power from the laser diodes is proportional to W. Taking account of the maximum width-error of about 1 $\mu$m on making the groove 12B by conventional etching through a photoresist mask, the designed value of W is eventually 4 $\mu$m.

This conventional etching technique is used also in making the window region as previously explained in FIG. 2F. This etching has to stop just at the interface between the active layer 15 and the optical guide layer 14. Otherwise, significant absorption would remain in the window (underetching case) or optical scattering, caused by decoupling between the thinner optical guide layer in the window and the thicker optical guide layer in the inner region, would deteriorate the lateral mode (overetching case).

It is concluded that this conventional window structure, both the waveguide and windows of which are made by the convenional etching technique, is not suitable for mass production because the accuracy of the etching is not high enough to make the windows.

FIG. 3 is a perspecive view of a second conventional window structure semiconductor laser, where the portion illustrated by a dotted line is partially cutaway. This construction is disclosed in "1985, Shunki Ouyou Butsuri Gakkai Kouen Yokoushu, 30p-ZB-10" (Extended Abstracts 30p-ZB-10, The 32nd Spring Meeting, 1985, The Japan Applied Physics and Related Societies).

In this laser, an active layer 34 is sandwiched by a lower optical guide layer 33 made of N-type $Al_{0.25}Ga_{0.75}As$ layer and an upper optical guide layer 35 made of P-type $Al_{0.25}Ga_{0.75}As$ layer 35. These layers are again sandwiched by an upper cladding layer 32 made of P-type $Al_{0.3}Ga_{0.7}As$ layer 32 and a lower cladding layer 36 made of N-type $Al_{0.3}Ga_{0.7}As$. On the upper cladding layer, an oxide layer 37 made of SiO2 with a stripe shape opening of width W is provided so that a driving current injected from the upper electrode is confined just under this opening.

The active layer 34 has a multiquantum well (MQW) structure comprising five 8 nm thick wells made of P-type GaAs and 12 nm thick barriers made of $Al_{0.2}Ga_{0.8}As$. In the region 38, which is located just outside the opening of the oxide mask 37 and shown by hatched lines in FIG. 3, zinc is diffused and the MQW structure of the active layer 34 is disordered because the interdiffusion of column III atoms is enhanced during the zinc diffusion. This disordered (or interdiffused) MQW has a smaller index and a wider bandgap than the ordered MQW just under the opening of the oxide mask 37. Therefore, an real index of width W is formed as well as windows near the mirrors.

In the real index guide of this prior art, the wave guide width W should be less than about 2 μm to achieve single lateral mode operation. However, the accuracy of zinc diffusion in the lateral direction is so poor that the wave guide width less than 2 μm can hardly realized. Therefore, this second conventional window structure is also unsuitable for mass production.

SUMMARY OF THE INVENTION

Therefore, an object of the present invention is to provide a method of manufacturing a window structure semiconductor laser in which the stripe width can be controlled with accuracy enough to achieve a stable single lateral mode operation and the windows are formed without requiring impractical accuracy manufacturing process.

Another object of the present invention is to provide a method of manufacturing a semiconductor laser which is suitable for mass production.

Further object of the present invention is to provide a semiconductor laser which is suitable for mass production.

To achieve the objects, this invention provides an improved method of manufacturing a semiconductor laser including an active layer made of III-V compound semiconductor material having a first band gap energy sandwiched by a first and a second carrier confining layers both made of III-V compound semiconductor material, a first and a second mirror facets forming a laser resonator therebetween cooperating with the active layer, a window region at the peripheral of the mirror facets formed by enlarging the band gap energy of the active layer, a first and a second electrode supplied with power source voltage therebetween for activating the active layer, and an optical waveguide layer of a stripe structure having a predetermined width and buried between the first and the second electrode layers, the improvement comprising the steps of: determining the width of the waveguide layer by an etching; and forming the window region by causing interdiffusion of Group IIIB atoms between the first carrier defining layer, the second carrier defining layer and the active layer.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Figure 1:
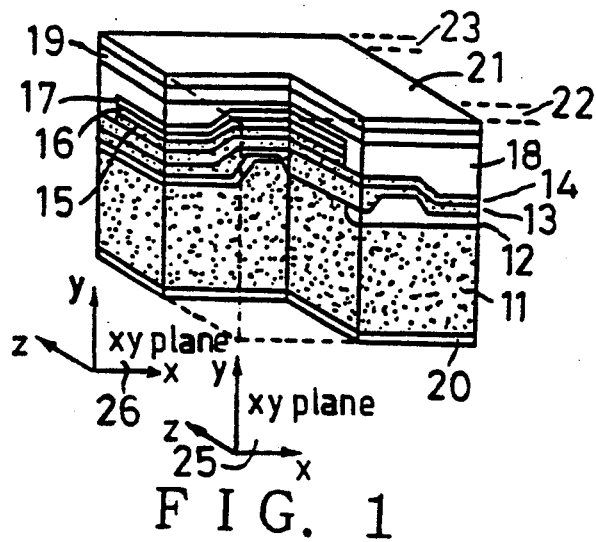
FIG. 1 is a perspective view of a conventional window structure semiconductor laser.
Figure 2A:
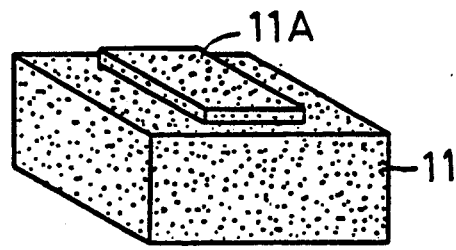
FIGS. 2A, 2B, 2C, 2D, 2E and 2F are perspective views for illustrating a method of manufacturing the semiconductor laser in FIG. 1.
Figure 2B:
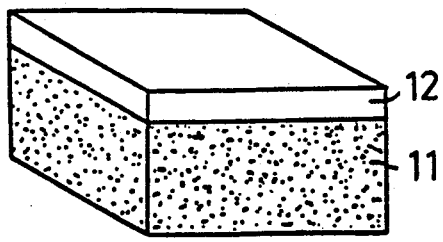
Figure 2C:
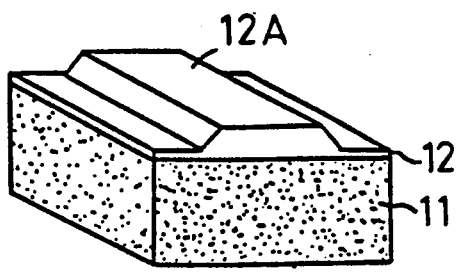
Figure 2D:
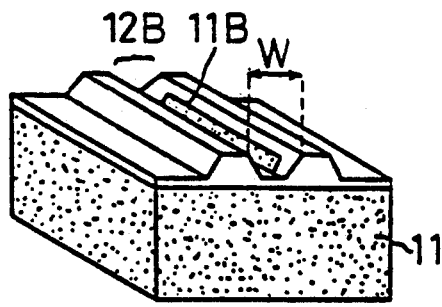
Figure 2E:
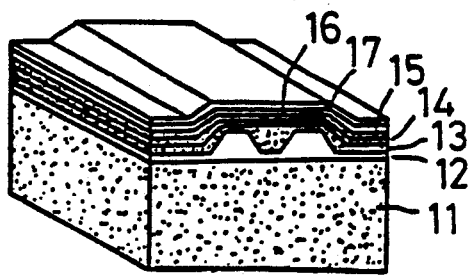
Figure 2F:
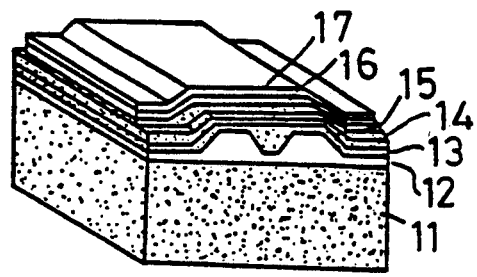
Figure 3:
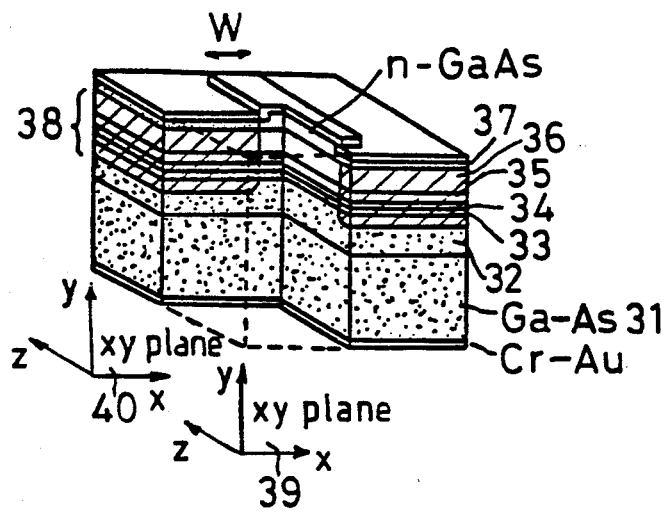
FIG. 3 is a perspective view of another conventional window structure semiconductor layer.

The present invention will be explained referring to drawings. In the drawings, only a portion corresponding to one semiconductor laser chip is illustrated for convenience of illustration. FIGS. 4A to 4G are perspective views for illustrating a first embodiment of the present invention.

Figure 4A:
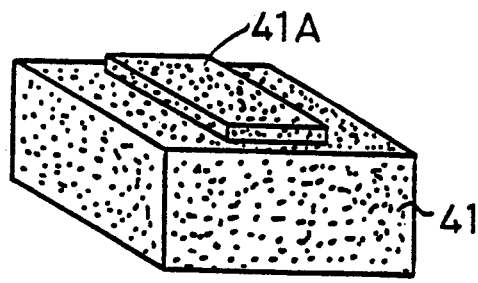
FIGS. 4A, 4B, 4C, 4D, 4E, 4F and 4G are perspective views for illustrating a first embodiment of the present invention.

In the first embodiment of the present invention, a semiconductor substrate 41 made of P-type GaAs is prepared, and the main surface thereof is partially etched to form a mesa 41A of about 1 μm height as shown in FIG. 4A.

Figure 4B:
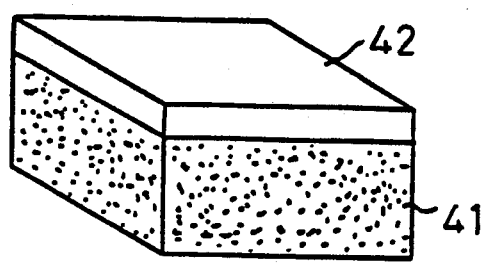

Next, a current blocking layer 42 made of N-type GaAs is formed on the semiconductor substrate 41 by a liquid phase epitaxial method (FIG. 4B). Due to the characteristic of the liquid phase epitaxial method, a flat surface is achieved on the semiconductor substrate in spite of the unevenness due to the mesa 41A.

Figure 4C:
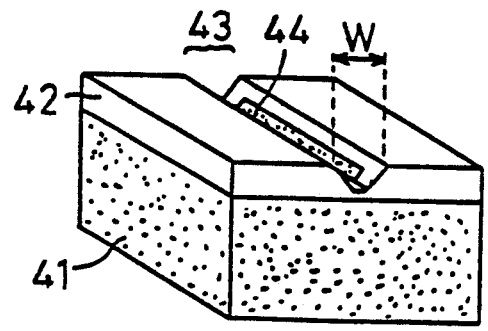

Then, an etching is carried out to expose the mesa partially as shown by 44. In this way, a groove 43 of approximately 4 μm width is formed. In this etching, the groove 43 is formed so as to partially expose the mesa 41A as illustrated by 44 to secure a current path for a layer formed later thereon. (FIG. 4C)

Figure 4D:
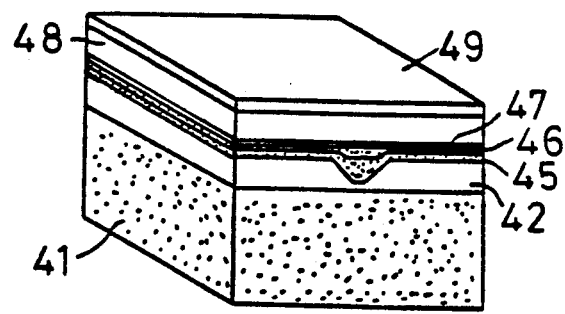

Next, a P-type $Al_{0.40}Ga_{0.60}As$ lower cladding layer 45, a P-type $Al_{0.35}Ga_{0.65}As$ optical waveguide layer 46, a P-type $Al_{0.12}Ga_{0.88}As$ active layer 47, an N-type $Al_{0.35}Ga_{0.65}As$ upper cladding layer 48 and an N-type GaAs ohmic contact layer 49 are successively formed by a liquid phase epitaxial method. Since the band gap energy of the P-type $Al_{0.35}Ga_{0.65}As$ layer 46 and of the N-type $Al_{0.35}Ga_{0.65}GaAs$ layer 48 are larger than that of the active layer 47, these layers act as carrier confining layers with respect to the active layer 47. The thickness of these layers 45, 46, 47, 48 and 49 outside the groove are 0.2 μm, 0.1 μm, 0.06 μm, 2.0 μm and 1.0 μm, respectively. The thickness of the layers 45 and 46 in the groove are 1.5 μm and 0.3 μm, respectively. (FIG. 4D)

Figure 4E:
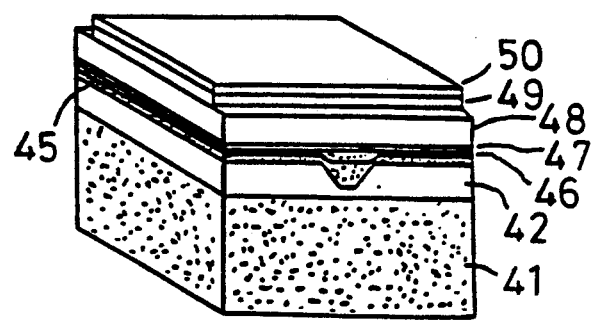
Figure 4F:
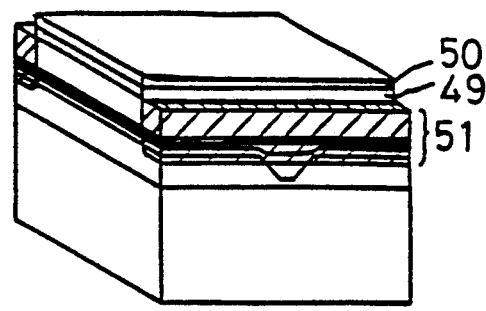
Figure 4G:
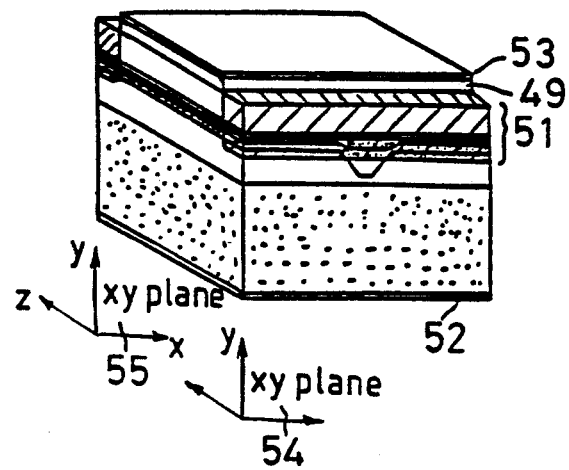

Then, a SiO2 layer is formed on the ohmic contact layer 49 by sputtering. The SiO2 layer is partially etched to form a patterned SiO2 layer 50. Then, the ohmic contact layer 49 is etched using the patterned SiO2 layer 50 as a mask layer. (FIG. 4E)

Next, zinc is introduced using the SiO2 layer 50 as a diffusion mask to form a zinc diffused region 51. (FIG. 4F) To diffuse the zinc, an annealing treatment of about one hour at 500° C. is carried out. At the zinc diffused region 51, an interdiffusion of Group IIIB atoms occurs between the layers 46, 47 and 48. As the result, the composition of the active layer 47 changes to $Al_xGa_{1-}$ xAs from the $Al_{0.12}Ga_{0.88}As$ at the original composition. The x is between 0.12 and 0.4, and is about 0.2, experimentally. Due to the increase of the Al ratio, the band gap energy of the active layer 47 at the zinc diffused region is made larger and the region becomes transparent with respect to the laser beam. In this way, a window is formed.

Then, the SiO2 layer 50 is removed by etching, and an upper metal layer 53 and a lower metal layer 52 are formed. The electrodes are supplied with power source voltages to activate the active layer 47. The wafer thus formed is cleaved to produce a semiconductor laser having mirror surfaces defined by the crystal end facets located at the zinc diffused layer. The mirror facets form a laser resonator cooperating with the active layer 47.

In this embodiment, the width W of the stripe or groove 43 is defined by etching. Since the control of the dimension using etching is easier than compared with diffusion, it is possible to achieve a stripe structure of high accuracy. The diffusion of the zinc is used only to form the window structure. Thus, the lateral diffusion of the zinc is not so critical to the characteristic of the laser.

FIGS. 5A to 5F are perspective views for illustrating a second embodiment of the present invention. In the second embodiment, an N-type $Al_{0.40}Ga_{0.60}As$ layer 62 acting as a lower cladding layer, a P-type $Al_{0.12}Ga_{0.88}As$ layer 63 acting as an active layer, a P-type $Al_{0.40}Ga_{0.60}As$ layer 64 acting as a first upper cladding layer and an N-type $Al_{0.40}Ga_{0.60}As$ layer 65 acting as a current blocking layer are successively formed on a semiconductor substrate 61 of an N-type GaAs by MOCVD method.

Figure 5A:
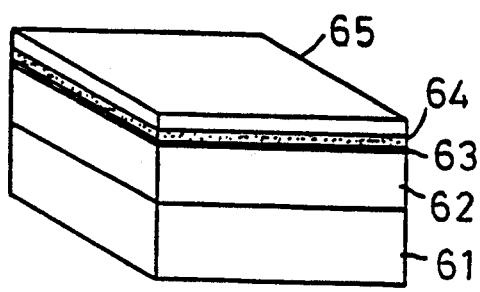
FIGS. 5A, 5B, 5C, 5D, 5E and 5F are perspective views for illustrating second embodiment of the present invention.

Since the band gap energy of the N-type $Al_{0.40}Ga_{0.60}As$ layer 62 and of the P-type $Al_{0.40}Ga_{0.60}As$ layer 64 are larger than that of the active layer 63, these layers act as carrier confining layers with respect to the active layer 63. The thickness of these layers 62, 63, 64 and 65 are 1.5 $\mu$m, 0.05 $\mu$m, 0.3 $\mu$m and 0.9 $\mu$m, respectively. (FIG. 5A)

Figure 5B:
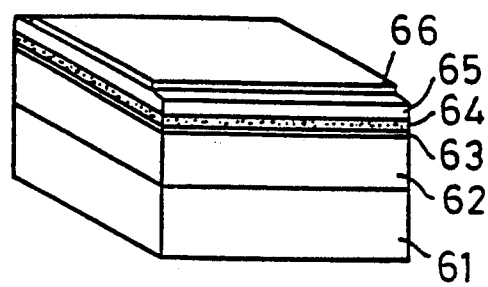
Figure 5C:
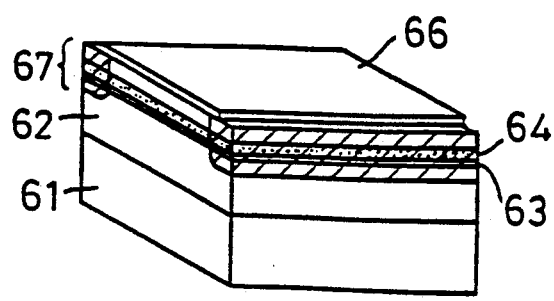
Figure 5D:
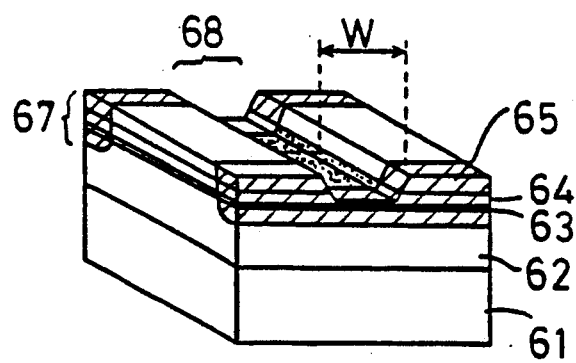

Next, an oxide layer, e.g. a SiO2 layer, is formed on the layer 65 by sputtering, and is partially etched to form a patterned SiO2 layer 66. (FIG. 5B)

Then, a zinc diffusion is performed using the patterned SiO2 layer 66 as a diffusion mask to form a zinc diffused region 67. (FIG. 5C) At this diffusion, an interdiffusion of Group IIIB atoms is performed between the active layer 63, the lower cladding layer 62 and the first upper cladding layer 64. As a result, the composition of the active layer 63 changes to AlxGa1−xAs from $Al_{0.12}Ga_{0.88}As$. The x is between 0.12 and 0.4, and is about 0.2, experimentally. Due to the increase of the Al ratio, the band gap energy is increased and the active layer diffused with the zinc becomes transparent with respect to the laser beam. In this way, a window structure is formed.

Next, the patterned SiO2 layer 66 is removed by etching, and a groove 68 of 1 $\mu$m width (illustrated by W) is formed by etching. (FIG. 5D) In this etching, the groove 68 is formed so as to partially expose the cladding layer 64 to secure a current path for a layer formed thereon later.

Figure 5E:
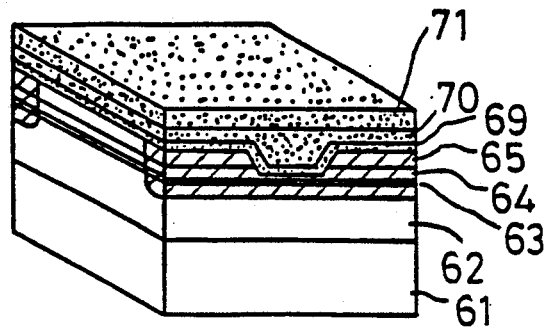
Figure 5F:
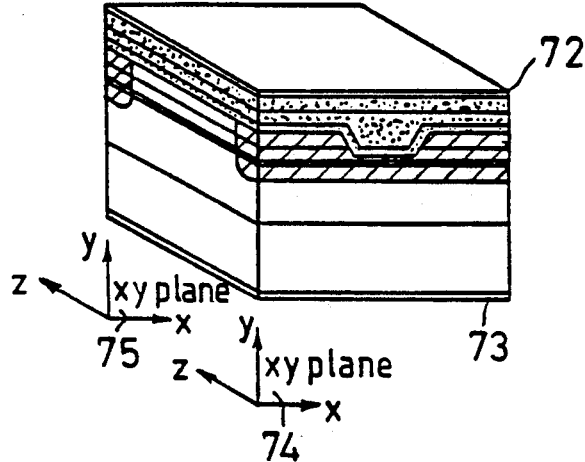

Then, a P-type $Al_{0.20}Ga_{0.80}As$ layer 69 acting as an optical waveguide layer, a P-type $Al_{0.40}Ga_{0.60}As$ layer 70 acting as a second upper cladding layer and a P-type GaAs layer 71 acting as an ohmic contact layer are formed successively by MOCVD method. (FIG. 5E)

The thickness of these layers 69, 70 and 71 are 0.2 $\mu$m, 1.5 $\mu$m and 2.0 $\mu$m, respectively.

Then, an upper electrode layer 72 and a lower electrode layer 73 are formed. The wafer thus formed is cleaved to produce a semiconductor laser having mirror facets 74 and 75 which are perpendicular to the surface of the semiconductor substrate 61. (FIG. 5F) The mirror facets form a laser resonator cooperating with the active layer 63.

In this embodiment, a stripe structure is constructed by the semiconductor layers on the groove 68. Namely, the stripe width W is defined by the etching. Thus, the accuracy of the stripe structure becomes more precise compared with the conventional method which uses the diffusion technique.

Figure 6A:
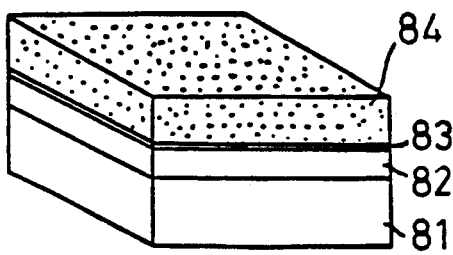
FIGS. 6A, 6B, 6C, 6D, 6E and 6F are perspective views for illustrating a third embodiment of the present invention.

FIGS. 6A to 6F are perspective views for illustrating a third embodiment of the present invention. In this embodiment, an N-type $Al_{0.40}Ga_{0.88}As$ layer 83 acting as an active layer and a P-type $Al_{0.40}Ga_{0.60}As$ layer 84 acting as an upper cladding layer are formed successively on an N-type GaAs semiconductor substrate 81 by the MOCVD method. Since the band gap energy of the N-type $Al_{0.40}Ga_{0.60}As$ layer 82 and of the P-type $Al_{0.40}Ga_{0.60}As$ layer 84 are larger than that of the active layer 83, these layers act as carrier confining layers with respect to the active layer 83. The thickness of these layers 82, 83 and 84 are 1.5 $\mu$m, 0.05 $\mu$m and 1.7 $\mu$m, respectively. (FIG. 6A)

Next, a SiO2 layer is formed on the upper cladding layer 84 by sputtering. The SiO2 layer is patterned to form a patterned SiO2 layer 85. The upper cladding layer 84 is partially etched using the patterned SiO2 layer 85 as an etching mask layer. (FIG. 6B) By this etching, a mesa 84A is formed. The height of the mesa 84A is 1.5 $\mu$m, and the width W thereof at the bottom is 3.5 $\mu$m.

Then, a P-type GaAs layer 87 containing zinc and an N-type GaAs layer 88 are successively formed on the cladding layer 84 by MOCVD method using the SiO2 layer 85 as a mask layer. (FIG. 6C)

Next, a thermal treatment of an hour at 500° C. is carried out to form a zinc diffused region 89 (illustrated by hatched lines) by a diffusion of zinc from the layer 89 to the active layer 83 and the lower cladding layer 82. (FIG. 6D) In the zinc diffused region 89, an interdiffusion of column III atoms occurs. As the result, the composition of the active layer 83 changes to AlXGa1-xAs from the original $Al_{0.12}Ga_{0.88}As$. The x is betweeen 0.12 and 0.4, and is about 0.2, experimentally. Due to the increase of the Al ratio, the active layer becomes transparent with respect to the laser beam. In this way, a window structure is formed.

Then, the SiO2 layer 85 is removed by etching, and a P-type GaAs layer 90 acting as an ohmic contact layer is formed on the layer 88 and the mesa 84A by MOCVD method. (FIG. 6E)

After an upper electrode layer 92 and a lower electrode layer 91 is formed, the wafer thus formed is cleaved to produce a semiconductor laser having mirror facets 93 and 94. (FIG. 6F) The mirror facets form a laser resonator cooperating with the active layer 83.

Figure 6B:
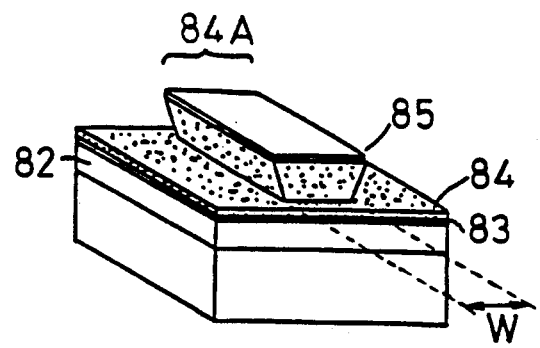
Figure 6C:
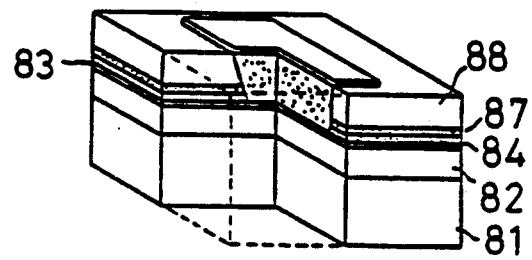
Figure 6D:
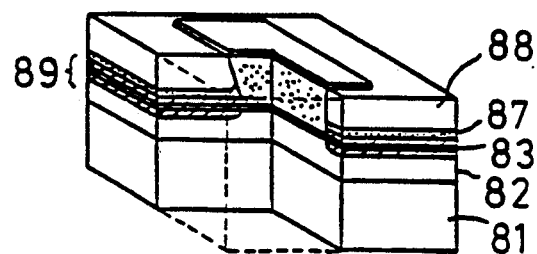
Figure 6E:
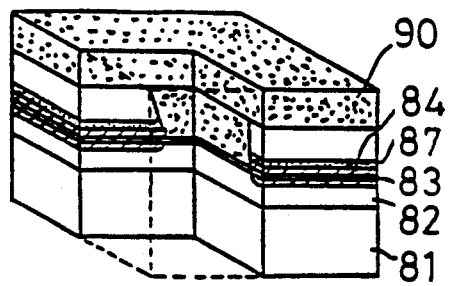
Figure 6F:
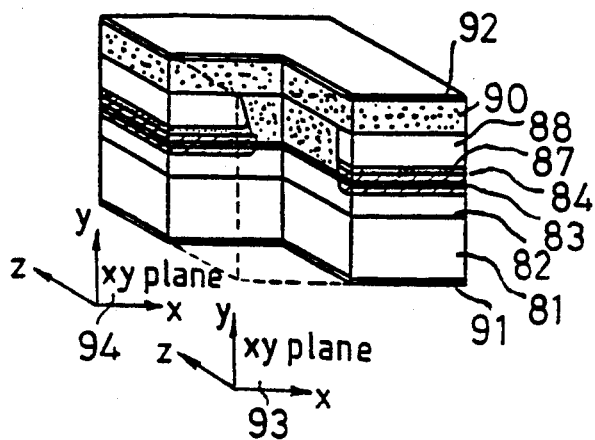

In this embodiment, the width W of the stripe structure is determined at the formation of the mesa 84A using etching as shown in FIG. 6B. Thus, the accuracy of the stripe structure is significantly improved compared with the conventional method which determines the stripe width by diffusion. In the present embodiment, the zinc is slightly diffused laterally during the diffusion process of the zinc from the cladding layer 87. However, the amount of the lateral diffusion of the zinc is negligible, since the zinc diffusion is performed only at the vicinity between the layer 87 and the active layer 83.

In the above described embodiments, zinc is used to promote the interdiffusion of the Al and Ga atoms. However, it is possible to use other atomic species, e.g. Cd, Si, Se and Mg, as long as it acts as donor or acceptor in the III-V compound semiconductor layer. Namely, in a P-type AlxGa1-xAs layer, the interdiffusion is promoted by annealing in As poor condition. On the other hand, the interdiffusion is promoted in As rich condition in the case of N-type AlxGa1-xAs layer. (see: Journal of Applied Physics, Vol. 64, No. 4, P1838, by D. G. Dep, 1988, August 15)

Moreover, any III-V compound semiconductor layer other than the AlxGa$_1$-xAs can be used.

The present invention has been described with respect to specific embodiments. However, other embodiments based on the principles of the present invention should be obvious to those of ordinary skill in the art. Such embodiments are intended to be covered by the claims.

What is claimed is:

1. An improved method of manufacturing a semiconductor laser, said laser including an active layer sandwiched by first and second carrier confining layers, the respective band gap energies of said carrier confining layers being larger than that of said active layer, resonator facets perpendicular to said active layer, and first and second electrode layers to be supplied with a voltage for activating said active layer, the improved method comprising the steps of:
    preparing a III-V compound semiconductor substrate having a main surface;
    forming a first III-V compound semiconductor carrier confining layer on the main surface;
    forming a III-V compound semiconductor active layer on the first carrier confining layer;
    forming a second III-V compound semiconductor carrier confining layer on the active layer;
    partially etching the second carrier confining layer to form a mesa; and
    interdiffusing group III atoms between the first carrier confining layer, the second carrier confining layer and the active layer to form a window region.

2. A method of manufacturing a semiconductor laser, comprising the steps of:
    preparing a III-V compound semiconductor substrate;
    partially etching the substrate to form a mesa;
    forming first III-V compound semiconductor layer to form a flat surface covering the mesa;
    partially etching the first semiconductor layer and the mesa to form a groove having a predetermined width;
    forming a second III-V compound semiconductor layer having a first band gap energy for filling the groove;
    forming on the second semiconductor layer a third III-V compound semiconductor layer having a second band gap energy smaller than the first band gap energy;
    forming on the third semiconductor layer a fourth III-V compound semiconductor layer having a third band gap energy larger than the second band gap energy;
    forming a mask layer on the fourth semiconductor layer;
    diffusing impurities into the second layer, the third layer and the fourth layer to produce an impurity diffused region using the mask layer as a diffusion mask; and
    cleaving the semiconductor substrate at a portion corresponding to the impurity diffused region to provide a mirror facet.

3. A method of manufacturing a semiconductor laser, comprising the steps of:
    preparing a III-V compound semiconductor substrate;
    forming on the semiconductor substrate a first III-V compound semiconductor layer having a first band gap energy;
    forming on the first semiconductor layer a second III-V compound semiconductor layer, having a second band gap energy smaller than the first band gap energy;
    forming on the second semiconductor layer a third III-V compound semiconductor layer, having a third band gap energy larger than the second band gap energy;
    forming on the third semiconductor layer a fourth III-V compound semiconductor layer having a fourth band gap energy;
    forming an oxide layer on the fourth layer;
    patterning the oxide layer into a predetermined shape;
    diffusing impurities into the first, the second, the third and the fourth layers to form an impurity diffused region using the patterned oxide layer as a diffusion mask;
    removing the patterned oxide layer;
    etching the third and the fourth semiconductor layers to form a groove disposed between regions diffused with the impurities;
    filling the groove with a fifth III-V compound semiconductor layer; and
    cleaving the semiconductor substrate at a portion corresponding to the impurity diffused region to provide a mirror facet.

4. A method of manufacturing a semiconductor laser, comprising the steps of:
    preparing a III-V compound semiconductor substrate of a first conductivity type;
    forming on the semiconductor substrate a first III-V compound semiconductor layer of the first conductivity type, having a first band gap energy;
    forming on the first semiconductor layer a second III-V compound semiconductor layer of a second conductivity type, having a second band gap energy smaller than the first band gap energy;
    forming on the second semiconductor layer a third III-V compound semiconductor layer of the second conductivity type, having a third band gap energy smaller than the band gap energy;
    etching the third semiconductor layer to form a mesa;
    forming a fourth semiconductor layer containing impurities of a predetermined conductivity type;
    forming a fifth semiconductor layer on the fourth semiconductor layer;
    diffusing the impurities in the fourth semiconductor layer to the second layer to form a disordered portion around the mesa;
    forming a sixth semiconductor layer of the second conductivity type on the fifth semiconductor layer; and
    cleaving the substrate at a portion corresponding to the disordered portion.

* * * * *